(12) United States Patent
Fu et al.

(10) Patent No.: US 10,885,296 B2
(45) Date of Patent: Jan. 5, 2021

(54) ELECTRONIC DEVICE AND FINGERPRINT SENSING METHOD

(71) Applicant: Guangzhou Tyrafos Semiconductor Technologies Co., LTD, Guangzhou (CN)

(72) Inventors: Hsu-Wen Fu, Kaohsiung (TW); Ping-Hung Yin, Taipei (TW); Jia-Shyang Wang, Miaoli County (TW); Chun-Yu Lee, New Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/261,594

(22) Filed: Jan. 30, 2019

(65) Prior Publication Data

US 2020/0042762 A1 Feb. 6, 2020

(30) Foreign Application Priority Data

Aug. 2, 2018 (TW) .............................. 107126908 A

(51) Int. Cl.
*G06K 9/00* (2006.01)
*G02B 27/30* (2006.01)
(Continued)

(52) U.S. Cl.
CPC ......... *G06K 9/00013* (2013.01); *G02B 1/041* (2013.01); *G02B 3/0006* (2013.01);
(Continued)

(58) Field of Classification Search
CPC ............. G06K 9/0004; G06K 9/00026; G06K 9/00–82; G09G 3/3225; G09G 3/2074;
(Continued)

(56) References Cited

U.S. PATENT DOCUMENTS

| 10,157,590 | B1 * | 12/2018 | Aflatooni | ............. G06K 9/0004 |
| 2008/0129653 | A1 * | 6/2008 | Yamazaki | ........... H01L 27/1214 |
| | | | | 345/55 |

(Continued)

FOREIGN PATENT DOCUMENTS

| CN | 106663156 | 5/2017 |
| CN | 106778459 | 5/2017 |

(Continued)

OTHER PUBLICATIONS

"Office Action of Taiwan Counterpart Application," dated Aug. 15, 2019, p. 1-p. 18.

*Primary Examiner* — Amr A Awad
*Assistant Examiner* — Aaron Midkiff

(57) ABSTRACT

An electronic device and a fingerprint sensing method are provided. The electronic device includes a display panel, a fingerprint sensor, and an integrated driver chip. The display panel includes a plurality of pixel units arranged in an array. The integrated driver chip integrates a display driver circuit and a fingerprint sensing circuit. When the pixel units of the display panel are in an undriven state and a finger object is in contact with a sensing area of the display panel to perform a fingerprint unlock operation, the display driver circuit drives at least a portion of the pixel units corresponding to the sensing area, so that at least a portion of the pixel units provide illumination light to the sensing area. The fingerprint sensing circuit drives the fingerprint sensor to capture a fingerprint feature image of the finger object.

18 Claims, 5 Drawing Sheets

(51) Int. Cl.
| | |
|---|---|
| G02B 1/04 | (2006.01) |
| G02B 3/00 | (2006.01) |
| G02B 27/09 | (2006.01) |
| G02B 27/42 | (2006.01) |
| G03F 7/20 | (2006.01) |
| H01L 23/00 | (2006.01) |
| H01L 27/146 | (2006.01) |
| H04N 5/232 | (2006.01) |
| G06F 13/42 | (2006.01) |
| H04N 1/00 | (2006.01) |
| G06F 13/20 | (2006.01) |
| G09G 3/3225 | (2016.01) |
| H04N 1/21 | (2006.01) |
| H04N 5/235 | (2006.01) |
| G11C 11/412 | (2006.01) |
| G11C 11/419 | (2006.01) |
| H01L 27/11 | (2006.01) |
| H04N 5/353 | (2011.01) |
| H04N 5/355 | (2011.01) |
| H04N 5/3745 | (2011.01) |
| H04N 5/378 | (2011.01) |
| H04L 29/08 | (2006.01) |

(52) U.S. Cl.
CPC ......... *G02B 27/0944* (2013.01); *G02B 27/30* (2013.01); *G02B 27/4233* (2013.01); *G03F 7/20* (2013.01); *G06F 13/20* (2013.01); *G06F 13/4282* (2013.01); *G06K 9/0004* (2013.01); *G09G 3/3225* (2013.01); *G11C 11/412* (2013.01); *G11C 11/419* (2013.01); *H01L 24/48* (2013.01); *H01L 27/1104* (2013.01); *H01L 27/14601* (2013.01); *H01L 27/14605* (2013.01); *H01L 27/14609* (2013.01); *H01L 27/14643* (2013.01); *H01L 27/14685* (2013.01); *H04N 1/00214* (2013.01); *H04N 1/2137* (2013.01); *H04N 5/2351* (2013.01); *H04N 5/2352* (2013.01); *H04N 5/2353* (2013.01); *H04N 5/2356* (2013.01); *H04N 5/232061* (2018.08); *H04N 5/3535* (2013.01); *H04N 5/35509* (2013.01); *H04N 5/35536* (2013.01); *H04N 5/35554* (2013.01); *H04N 5/35581* (2013.01); *H04N 5/378* (2013.01); *H04N 5/37452* (2013.01); *H04N 5/37455* (2013.01); *G06F 2213/0002* (2013.01); *G09G 2320/064* (2013.01); *G09G 2354/00* (2013.01); *H01L 2224/48091* (2013.01); *H04L 67/10* (2013.01); *H04N 2201/0084* (2013.01)

(58) Field of Classification Search
CPC ................. G09G 3/3607; G09G 3/364; G09G 2300/0443; G09G 2340/0457; G09G 3/00–38; G09G 2300/00–0895; G09G 2320/064; G09G 2340/00–16; G09G 2354/00; G02B 1/041; G02B 3/0006; G02B 27/00–648; G03F 7/20; G06F 13/20; G06F 13/4282; G06F 2213/0002; G11C 11/41–419; H01L 27/00–3297; H01L 24/48; H01L 2224/48091; H04L 67/10; H04N 1/00214; H04N 1/2137; H04N 5/00–956; H04N 2201/0084
USPC .................................. 345/694; 382/115–124
See application file for complete search history.

(56) References Cited

U.S. PATENT DOCUMENTS

| | | | | |
|---|---|---|---|---|
| 2017/0257534 | A1* | 9/2017 | Huang | G06K 9/2081 |
| 2018/0040675 | A1* | 2/2018 | Zeng | G06K 9/0004 |
| 2018/0300526 | A1* | 10/2018 | Cho | G06K 9/00013 |

FOREIGN PATENT DOCUMENTS

| | | |
|---|---|---|
| CN | 107066859 | 8/2017 |
| CN | 107071153 | 8/2017 |
| CN | 107194326 | 9/2017 |

* cited by examiner

Drive at least one portion of a plurality of pixel units of a display panel corresponding to a sensing area through a display driver circuit integrated in an integrated driver chip when the pixel units are in an undriven state and a finger object is in contact with the sensing area of the display panel to perform a fingerprint unlock operation such that the at least one portion of the pixel units provide an illumination light to the sensing area — S510

Drive a fingerprint sensor through a fingerprint sensing circuit integrated in the integrated driver chip to capture a fingerprint feature image of the finger object — S520

FIG. 5

Drive a fingerprint sensor through a fingerprint sensing circuit to capture a light-emitting state image of a sensing area of a display panel — S610

Analyze the light-emitting state image through the fingerprint sensing circuit such that an integrated driver chip adjusts a driving voltage or a driving current provided by a display driver circuit to the display panel according to the light-emitting state image — S620

Record an adjustment history of the driving voltage or the driving current through the integrated driver chip and return the adjustment history to an external cloud server — S630

FIG. 6

ELECTRONIC DEVICE AND FINGERPRINT SENSING METHOD

CROSS-REFERENCE TO RELATED APPLICATION

This application claims the priority benefit of Taiwan application serial no. 107126908, filed on Aug. 2, 2018. The entirety of the above-mentioned patent application is hereby incorporated by reference herein and made a part of this specification.

BACKGROUND OF THE DISCLOSURE

Field of the Disclosure

The disclosure is related to a fingerprint sensing technique, and more particularly, to an electronic device and a fingerprint sensing method using an under-display fingerprint sensing technique.

Description of Related Art

For an electronic device having an active-matrix organic light-emitting diode (AMOLED) display provided with an optical under-display fingerprint sensor, the general fingerprint unlock mechanism involves that the operating system of the electronic device needs to first output a drive command to first illuminate the AMOLED display and provide illumination light to a finger object pressed on the AMOLED display. Then, the operating system of the electronic device outputs another driver command to drive the fingerprint sensor to capture a fingerprint feature image. Lastly, the operating system of the electronic device analyzes the fingerprint feature image to determine if an unlock operation is to be performed. However, the reaction speed of the general fingerprint unlock mechanism is too slow, and the AMOLED display is often entirely illuminated from the beginning and continues until the unlocking operation is completed, thus wasting power for the electronic device. In view of this, solutions of several exemplary embodiments are presented below.

SUMMARY OF THE DISCLOSURE

The disclosure provides an electronic device and a fingerprint sensing method that may rapidly drive a display panel and a fingerprint sensor through an integrated driver chip, and may only drive a portion of pixel units corresponding to a sensing area of the display panel to provide a light source needed for fingerprint sensing. Therefore, the electronic device and the fingerprint sensing method of the disclosure may have the effects of power consumption reduction and rapid sensing.

An electronic device of the disclosure includes a display panel, a fingerprint sensor, and an integrated driver chip. The display panel includes a plurality of pixel units arranged in an array. The fingerprint sensor is disposed below a sensing area of the display panel. The integrated driver chip is coupled to the display panel and the fingerprint sensor and is integrated with a display driver circuit and a fingerprint sensing circuit. The display driver circuit is configured to drive the display panel, and the fingerprint sensing circuit is configured to drive the fingerprint sensor. When the pixel units of the display panel are in an undriven state and a finger object is in contact with the sensing area of the display panel to perform a fingerprint unlock operation, the display driver circuit drives at least one portion of the pixel units corresponding to the sensing area, so that the at least one portion of the pixel units provide illumination light to the sensing area. The fingerprint sensing circuit drives the fingerprint sensor to capture a fingerprint feature image of the finger object.

A fingerprint sensing method of the disclosure is suitable for an electronic device. The electronic device includes a display panel, a fingerprint sensor, and an integrated driver chip. The display panel includes a plurality of pixel units arranged in an array. The fingerprint sensing method includes the following steps. When the pixel units of the display panel are in an undriven state and a finger object is in contact with a sensing area of the display panel to perform a fingerprint unlock operation, at least one portion of the pixel units corresponding to the sensing area are driven through a display driver circuit integrated in the integrated driver chip such that the at least one portion of the pixel units provide illumination light to the sensing area. The fingerprint sensor is driven by a fingerprint sensing circuit integrated in the integrated driver chip to capture a fingerprint feature image of the finger object.

Based on the above, the electronic device and the fingerprint sensing method of the disclosure may drive a display panel and a fingerprint sensor by integrating a display driver circuit and an integrated driver chip of a fingerprint sensing circuit, and when fingerprint sensing is performed, a portion of the pixel units corresponding to a sensing area of the display panel may be instantly driven without driving other pixel units outside the sensing area.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a portion of this specification. The drawings illustrate embodiments of the disclosure and, together with the description, serve to explain the principles of the disclosure.

FIG. 5 is a flowchart of a fingerprint sensing method according to an embodiment of the disclosure.

FIG. 6 is a flowchart of a fingerprint sensing method according to another embodiment of the disclosure.

DESCRIPTION OF THE EMBODIMENTS

Figure 1:
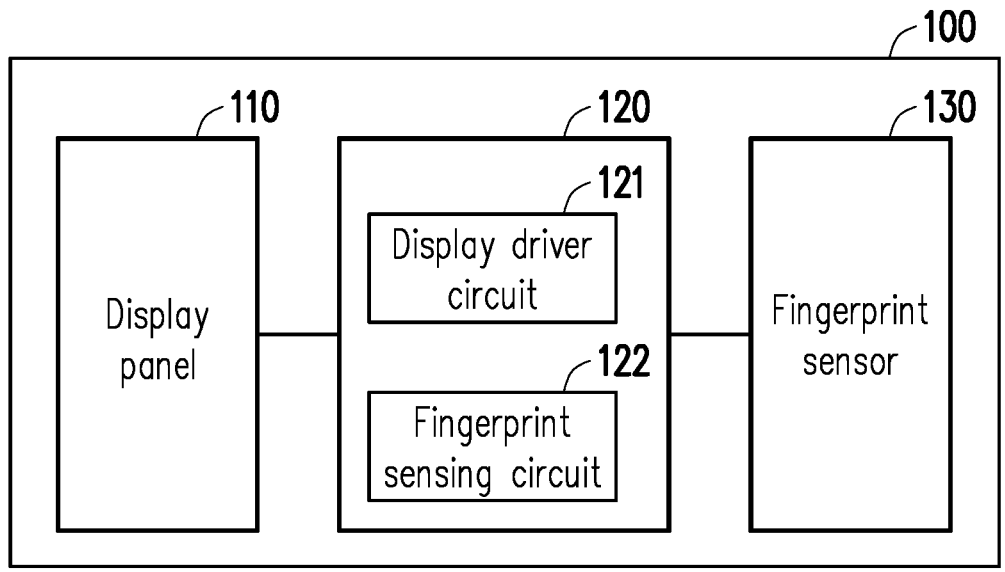
FIG. 1 is a block diagram of an electronic device according to an embodiment of the disclosure.

To make the contents of the disclosure more easily understood, embodiments are provided below as examples of the plausibility of implementation of the disclosure. Moreover, when applicable, devices/elements/steps having the same reference numerals in figures and embodiments represent the same or similar parts.

FIG. 1 is a block diagram of an electronic device according to an embodiment of the disclosure. Referring to FIG. 1, an electronic device 100 includes a display panel 110, an integrated driver chip 120, and a fingerprint sensor 130. The integrated driver chip 120 is coupled to the display panel 110 and the fingerprint sensor 130. In the present embodiment, the integrated driver chip 120 is a system-on-chip (SoC), and the integrated driver chip 120 is integrated with a display driver circuit 121 and a fingerprint sensing circuit 122. The display driver circuit 121 is configured to drive the display panel 110. The fingerprint sensing circuit 122 is configured to drive the fingerprint sensor 130.

In the present embodiment, the electronic device 100 may be a portable electronic product adopting an under-display optical fingerprint technique, such as a mobile phone, a tablet, or a laptop, etc., and the disclosure is not limited thereto. In the present embodiment, the display panel 110 may be an active-matrix organic light-emitting diode (AMOLED) and has a plurality of pixel units arranged in an array. In the present embodiment, the fingerprint sensor 130 may be an optical under-display fingerprint sensor and includes a complementary metal-oxide-semiconductor (CMOS) sensor. In the present embodiment, the circuit of the fingerprint sensor 130 disposed below the sensing area of the display panel 110 may be integrated with the display driver circuit 121 as an SoC. Therefore, when the electronic device 100 performs a fingerprint unlock operation, the display driver circuit 121 may individually illuminate at least one portion of the pixel units on the display panel 110 corresponding to the sensing area of the fingerprint sensing circuit 122.

It should be noted that the fingerprint unlock operation refers to when the electronic device 100 is operating in, for example, a screen lock state, a hibernate state, a sleep state, or a protection state and if the user wishes to restore or operate the application function of the electronic device 100, then the user must first perform identity verification or screen unlocking. Therefore, the electronic device 100 needs to perform identity verification or screen unlocking through fingerprint recognition.

Figure 2:
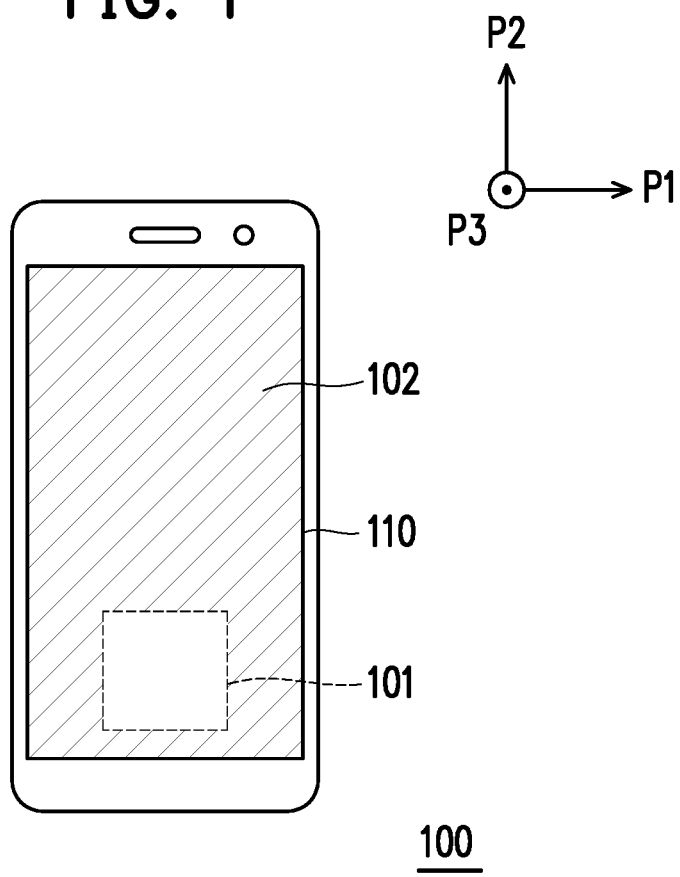
FIG. 2 is a schematic of an electronic device according to an embodiment of the disclosure.

FIG. 2 is a schematic of an electronic device according to an embodiment of the disclosure. Referring to FIG. 1 and FIG. 2, the electronic device 100 may be a mobile phone as shown in FIG. 2. The display surface of the electronic device 100 faces a third direction P3. A first direction P1, a second direction P2, and the third direction P3 are perpendicular to each other. In the present embodiment, when the electronic device 100 is operating in a screen lock, a standby, or a hibernate state and if the user wants to use the electronic device 100, then the user must first unlock to enter the operating system screen of the electronic device 100. At this time, the display panel 110 has not been illuminated, and the pixel units of the display panel 110 are in an undriven state. However, when a finger object is in contact with (or presses) the sensing area 101 of the display panel 110 to perform the fingerprint unlock operation, the display driver circuit 121 drives at least one portion of the pixel units corresponding to the sensing area 101 such that the at least one portion of the pixel units provide illumination light to the sensing area 101. Next, the fingerprint sensing circuit 122 drives the fingerprint sensor to capture a fingerprint feature image of the finger object. In the present embodiment, the processor of the electronic device 100 performs fingerprint recognition according to the fingerprint feature image to determine whether to unlock the screen or enter the operating system screen of the electronic device 100.

In other words, when the electronic device 100 performs the fingerprint unlock operation, the display driver circuit 121 may individually illuminate the at least one portion of the pixel units on the display panel 110 corresponding to the sensing area 101 of the fingerprint sensing circuit 122. Also, a non-sensing area 102 of the display panel 110 corresponds to another portion of the pixel units, and when the electronic device 100 performs the fingerprint unlock operation, the other portion of the pixel units corresponding to the non-sensing area 102 remains in the undriven state. In the present embodiment, the sensing area 101 of the display panel 110 is smaller than the non-sensing area 102. The display area of the display panel 110 includes the sensing area 101 and the non-sensing area 102. In other words, the sensing area 101 of the display panel 110 is smaller than the display area.

It should be noted that in the present embodiment, the display panel 110 may be an active-matrix organic light-emitting display, and thus the pixel units of the display panel 110 may include a plurality of color pixel types (e.g., red, blue, green). Therefore, when the finger object is in contact with the sensing area 101 of the display panel 110 to perform the fingerprint unlock operation, the at least one portion of the pixel units driven by the display driver circuit 121 may be at least one of the color pixel types. In other words, when the electronic device 100 performs the fingerprint unlock operation, the display driver circuit 121 may individually illuminate at least one portion of the specific color pixel types of the pixel units on the display panel 110 corresponding to the sensing area 101 of the fingerprint sensing circuit 122, such as individually illuminating the red pixel units to provide only red illumination light. The display driver circuit 121 may determine the pixel units of a specific color pixel type in the sensing area 101 on the display panel 110 according to different fingerprint sensing requirements or device requirements to provide the effects of power saving, convenience, and flexible operation of the pixel units.

Figure 3:
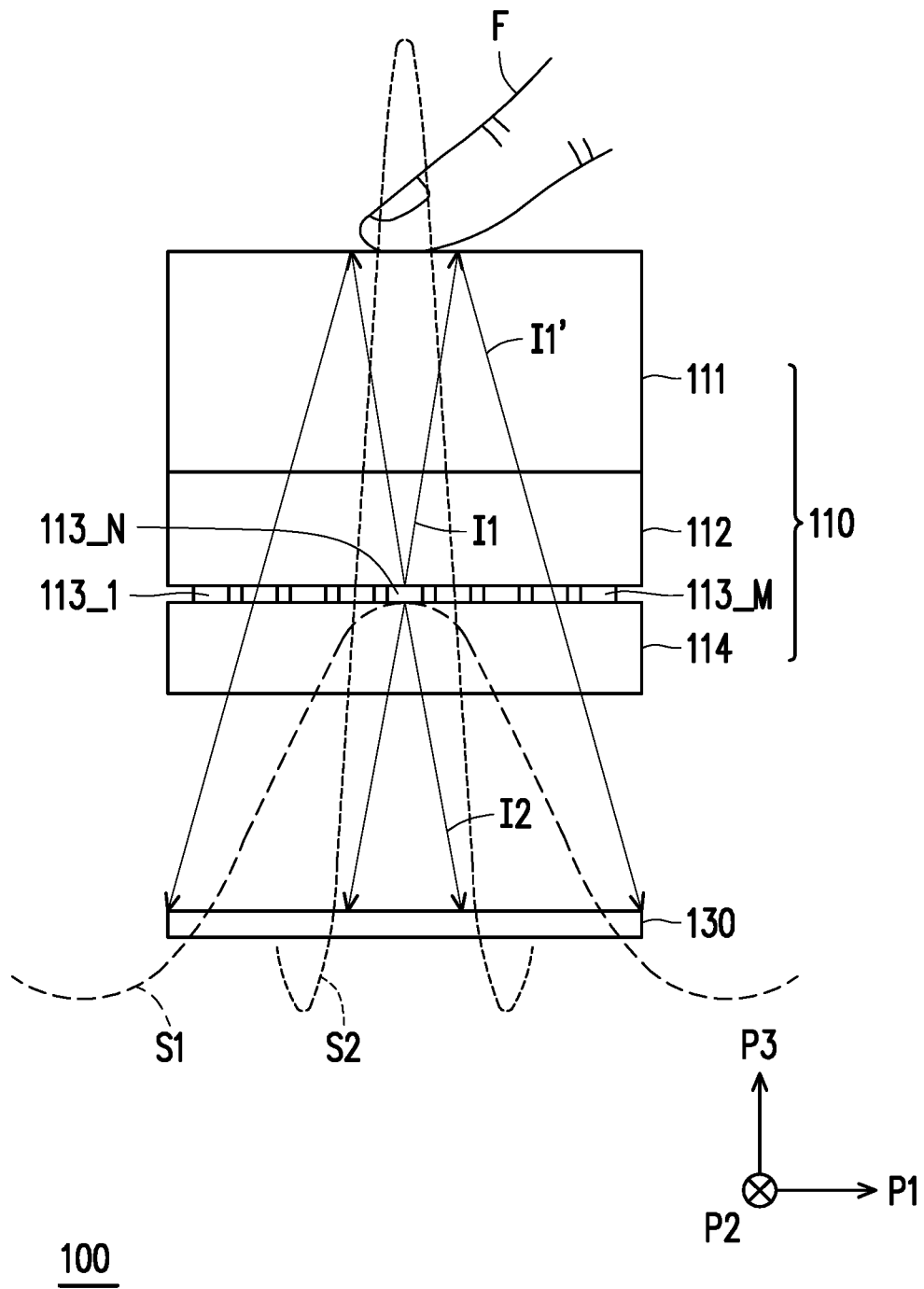
FIG. 3 is schematic diagram of an architecture of an electronic device in a sensing area according to an embodiment of the disclosure.

FIG. 3 is schematic diagram of an architecture of an electronic device in a sensing area according to an embodiment of the disclosure. Referring to FIG. 1 to FIG. 3, FIG. 3 is an under-display optical fingerprint sensing architecture. The electronic device 100 includes the display panel 110 and the fingerprint sensor 130. In the present embodiment, the electronic device 100 provides a display screen in the first direction P1. The fingerprint sensor 130 is disposed below the sensing area 101 of the display panel 110, and there is a gap between the display panel 110 and the fingerprint sensor 130. In the present embodiment, the display panel 110 may include a glass panel 111, a cover panel 112, a plurality of pixel units 113_1 to 113_M, and a substrate 114. M is a positive integer greater than 1. The glass panel 111, the cover panel 112, the plurality of pixel units 113_1 to 113_M, and the substrate 114 are sequentially stacked from top to bottom.

In the case of one pixel unit 113_N, N is a positive integer greater than 1 and less than or equal to M. When the electronic device 100 performs the fingerprint unlock operation, the pixel unit 113_N is illuminated to provide an illumination light I1 toward the glass panel 111 and the cover panel 112 and simultaneously provide an illumination light I2 toward the fingerprint sensor 130. When a finger object F touches the glass panel 111, the illumination light I1 is reflected by the contact surface of the finger object F and the glass panel 111, so that an image light I1' having the fingerprint feature information of the finger object F is incident on the fingerprint sensor 130 in a direction opposite to the third direction P3. However, since an optical signal intensity S2 of the illumination light I2 directly below the pixel unit 113_N is greater than the optical signal intensity S1 of the image light IF, the noise of the fingerprint image obtained by the fingerprint sensor 130 directly below the pixel unit 113_N is higher. In other words, since the illumination light 12 does not have the fingerprint feature information, when both the image light I1' and the illumination light 12 enter the fingerprint sensor 130, the illumination light 12 becomes background light noise in the fingerprint feature image generated by the fingerprint sensor 130, and as a result the fingerprint features displayed by the image light IF are affected. In this regard, the recognizability and accuracy of the fingerprint image captured by the fingerprint sensor 130 need to be increased. In the present embodiment, the electronic device 100 reduces the effect of the illumination light 12 by making the at least one portion of the driven pixel units 113_1 to 113_M of the display panel 110 in the sensing area 101 display a light source pattern and by providing the light source pattern with a periodic variation pattern.

It should be noted that the light source pattern in the above embodiment has a plurality of ordered patterns or a plurality of disordered patterns, and is further explained below by examples of several light source patterns presented in FIG. 4A to FIG. 4C.

Figure 4A:
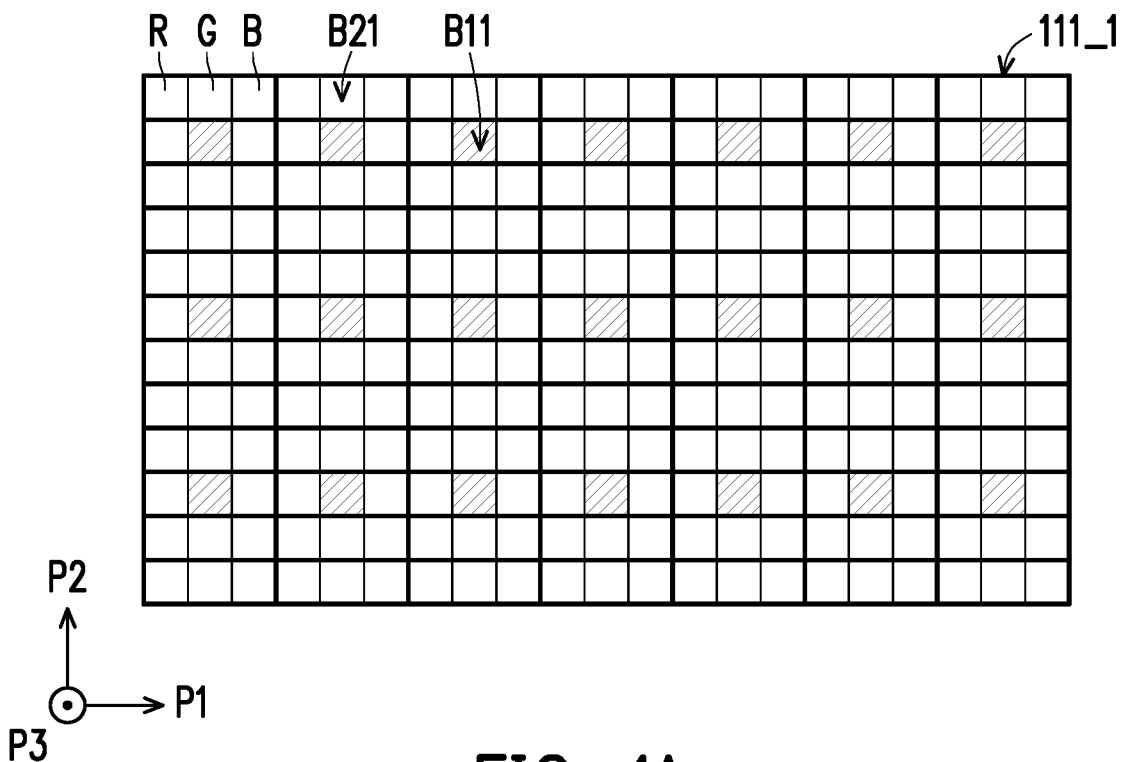
FIG. 4A to FIG. 4C are schematic diagrams illustrating examples of a plurality of light source patterns according to an embodiment of the disclosure.
Figure 4B:
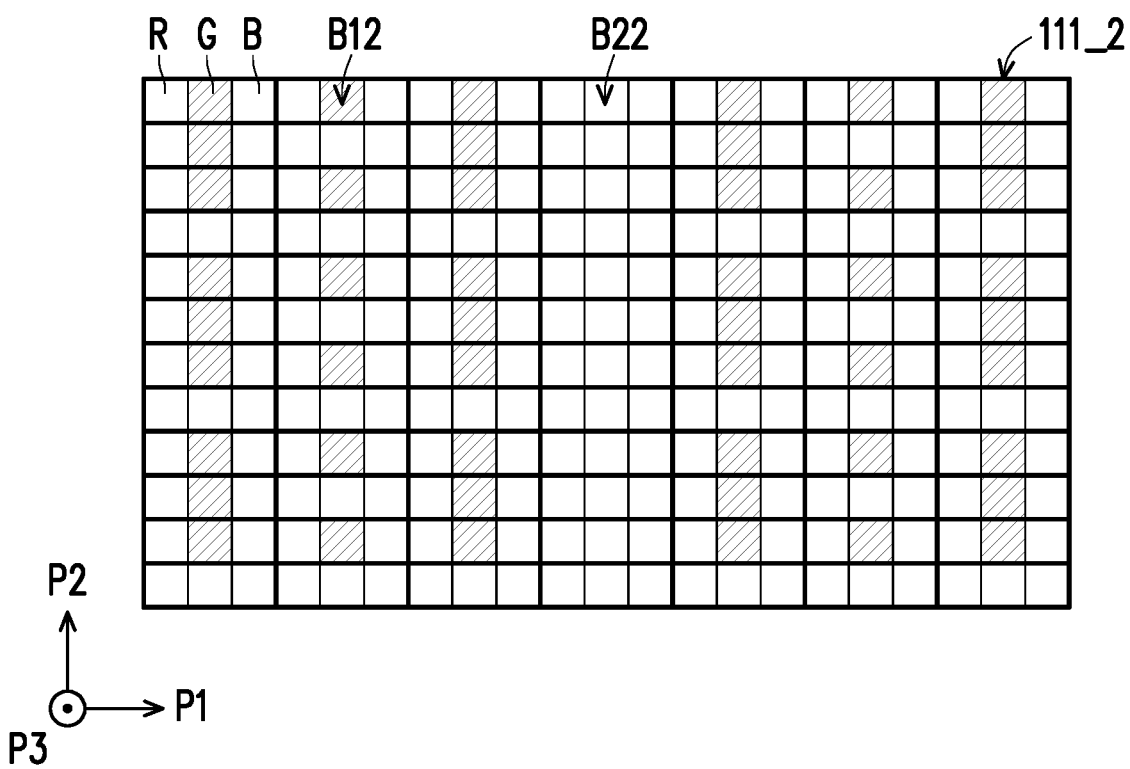
Figure 4C:
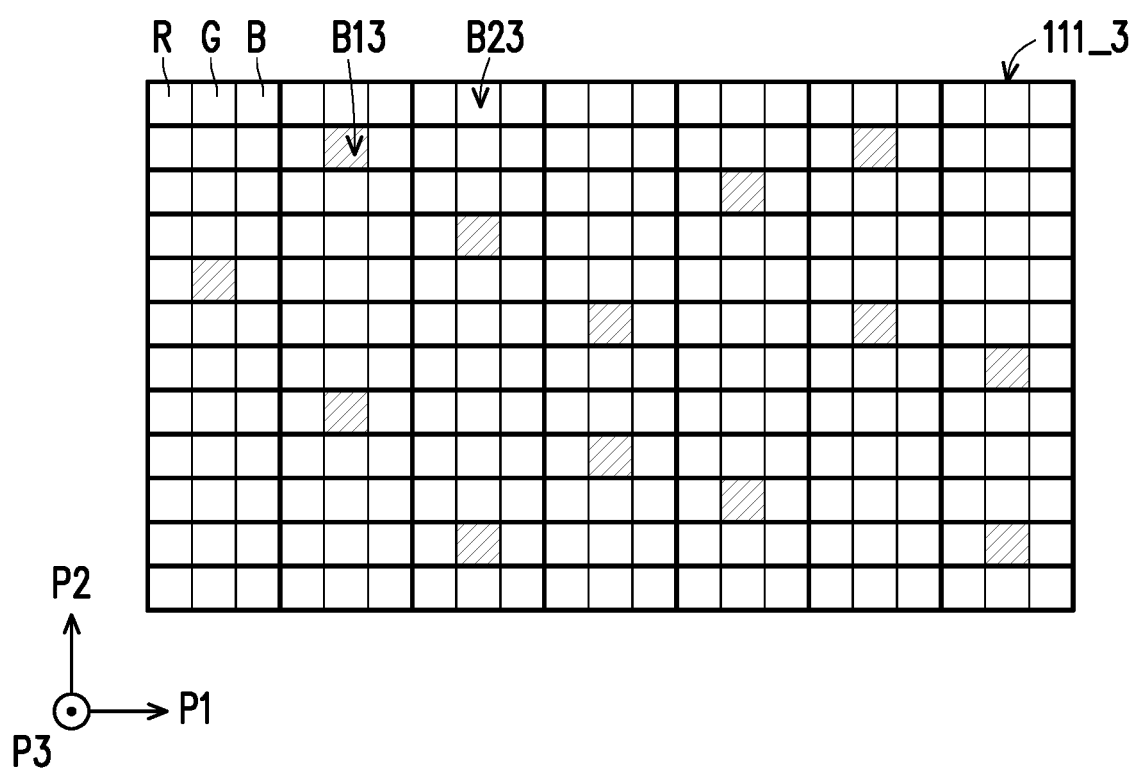

FIG. 4A to FIG. 4C are schematic diagrams each illustrating an example of a plurality of light source patterns according to an embodiment of the disclosure. Referring to FIG. 1 to FIG. 3 and FIG. 4A, the pixel units 113_1 to 113_M may respectively be formed by a red pixel R, a green pixel G, and a blue pixel B, but the disclosure is not limited thereto. When the pixel units 113_1 to 113_M of the display panel 100 are in the undriven state and the finger object F is in contact with the sensing area 101 of the display panel 110 to perform the fingerprint unlock operation, the at least one portion of the driven pixel units 113_1 to 113_M of the display panel 110 in the sensing area 101 display a light source pattern 111_1 as shown in FIG. 4A. The light source pattern 111_1 may have a plurality of ordered patterns, and the ordered patterns are formed by a plurality of bright area patterns B11 (areas marked with diagonal lines). In this example, the light source pattern 111_1 may include a plurality of bright area patterns B11 and continuous dark area patterns B21 (areas without diagonal lines), and these bright area patterns B11 are arranged in an orderly manner and in a periodic manner in the second direction P2. It should be noted that these bright area patterns B11 indicate that the green pixels G of the at least one pixel unit of the corresponding plurality of areas in the display panel 110 are illuminated (the red pixel R or the blue pixel B may also be selected to be illuminated), and the dark area patterns B21 indicate that the remaining pixels apart from the green pixels G in the bright area patterns B11 in the display panel 110 are not illuminated (undriven state) or provided at a lower brightness, but the disclosure is not limited thereto. In an embodiment, the bright area patterns B11 may also indicate that the red pixel R, the green pixel G, and the blue pixel B of at least one pixel unit of the corresponding plurality of areas in the display panel 110 are all illuminated to emit white light. In this regard, a portion of the image of the fingerprint image captured by the fingerprint sensor 130 corresponding to the dark area patterns B21 may effectively prevent the direct illumination of the illumination light on the pixel units that cause the noise ratio to be too high. In other words, a portion of the image of the fingerprint image captured by the fingerprint sensor 130 may have a lower noise ratio, so that the noise ratios of the entire fingerprint image are not all too high.

Referring to FIG. 1 to FIG. 3 and FIG. 4B, in the same manner as the above example of FIG. 4A, when the electronic device 100 executes the fingerprint unlock operation, the sensing area 101 may display a light source pattern 111_2, wherein the light source pattern 111_2 may have a plurality of ordered patterns. These ordered patterns are formed by a plurality of bright area patterns B12 (areas with diagonal lines) and a plurality of dark area patterns B22 (areas without diagonal lines). In this example, the light source pattern 111_2 may include a portion of the plurality of bright area patterns B12 and a plurality of continuous dark area patterns B22, and the bright area patterns B12 are presented in a specific graphic manner. As shown in FIG. 4B, these bright area patterns B12 may be arranged in rectangular shapes, and the center is the dark area pattern B22 graphic. These bright area pattern B12 graphics may be arranged in an array in the first direction P1 and the second direction P2, or may be arranged in other orderly manner or periodic manner, but the disclosure is not limited thereto. The positions of these bright area patterns B12 may be determined according to the characteristics of the fingerprint sensor 130 or the image capturing requirements. In other words, in an embodiment, the positions of the graphics formed through these bright area patterns B12 may also be randomly arranged. It should be noted that these bright area patterns B12 indicate that the green pixels G of the at least one pixel unit of the corresponding plurality of areas in the display panel 110 are illuminated (the red pixel R or the blue pixel B may also be selected to be illuminated), and the dark area patterns B22 indicate that the remaining pixels apart from the green pixels G in the bright area patterns B12 in the display panel 110 are not illuminated (undriven state) or provided at a lower brightness, but the disclosure is not limited thereto. In an embodiment, the bright area patterns B12 may also indicate that the red pixel R, the green pixel G, and the blue pixel B of at least one pixel unit of the corresponding plurality of areas in the display panel 110 are all illuminated to emit white light. In this regard, a portion of the image of the fingerprint image captured by the fingerprint sensor 130 corresponding to the dark area patterns B22 may effectively prevent the direct illumination of the illumination light on the pixel units that cause the noise ratio to be too high. In other words, a portion of the image of the fingerprint image captured by the fingerprint sensor 130 may have a lower noise ratio, so that the noise ratios of the entire fingerprint image are not all too high.

Referring to FIG. 1 to FIG. 3 and FIG. 4C, in the same manner as the above example of FIG. 4A, when the electronic device 100 executes the fingerprint unlock operation, the sensing area 101 may display a light source pattern 111_3, wherein the light source pattern 111_3 may have a plurality of disordered patterns. These disordered patterns include a plurality of bright area patterns B13 (areas with diagonal lines). In this example, the light source pattern 111_3 may include these bright area patterns B13 and continuous dark area patterns B23 (areas without diagonal lines), and these bright area patterns B13 are arranged in an unorderly manner. It should be noted that these bright area patterns B13 indicate that the green pixels G of the at least one pixel unit of the corresponding plurality of areas in the display panel 110 are illuminated (the red pixel R or the blue pixel B may also be selected to be illuminated), and the dark area patterns B23 indicate that the remaining pixels apart from the green pixels G in the bright area patterns B13 in the display panel 110 are not illuminated (undriven state) or provided at a lower brightness, but the disclosure is not limited thereto. In an embodiment, the bright area patterns B13 may also indicate that the red pixel R, the green pixel G, and the blue pixel B of at least one pixel unit of the corresponding plurality of areas in the display panel 110 are all illuminated to emit white light. In this regard, a portion of the image of the fingerprint image captured by the fingerprint sensor 130 corresponding to the dark area patterns B23 may effectively prevent the direct illumination of the illumination light on the pixel units that cause the noise ratio to be too high. In other words, a portion of the image of the fingerprint image captured by the fingerprint sensor 130 may have a lower noise ratio, so that the noise ratios of the entire fingerprint image are not all too high.

According to the above examples of FIG. 4A to FIG. 4C, it should be noted that the bright area patterns of the disclosure may be one of the red pixel R, the green pixel G, and the blue pixel B to be illuminated to emit light of a specific color. Alternatively, the red pixel R, the green pixel G, and the blue pixel B are all illuminated according to different usage requirements to emit white light. That is to say, the method of forming the bright area patterns by illuminating the pixels of one portion of the pixel units 113_1 to 113_M in the disclosure may actually determine to illuminate pixels of a specific color or all color pixels in a pixel unit according to different fingerprint recognition requirements.

However, in an embodiment, when the electronic device 100 performs the fingerprint unlock operation, the fingerprint sensor 130 is not limited to capturing one fingerprint feature image. The at least one portion of the driven pixel units 113_1 to 113_M of the display panel 110 in the sensing area 101 may continuously display a plurality of light source patterns having different periodic variation patterns. For example, the display panel 110 may alternately display the light source pattern 111_1 of FIG. 4A and the light source pattern 111_2 of FIG. 4B in the sensing area 101, and the fingerprint sensor 130 correspondingly captures two fingerprint feature images of the finger object F. Since the positions of the dark area patterns B21 and B22 of the light source pattern 111_1 and the light source pattern 111_2 are different, the clearer portions of the corresponding two fingerprint feature images are also different (the positions where the noise is lower are different). Therefore, the fingerprint sensing circuit 130 may recombine the two fingerprint feature images. The fingerprint sensing circuit 130 may generate a recombined fingerprint feature image by superimposing the clearer portions of the two fingerprint feature images (the portions of the images where the noise is lower are superimposed). In this regard, compared to the above two fingerprint feature images, the overall image of the recombined fingerprint feature image is clearer and has good recognizability.

FIG. 5 is a flowchart of a fingerprint sensing method according to an embodiment of the disclosure. Referring to FIG. 1 to FIG. 3 and FIG. 5, the fingerprint sensing method of the present embodiment may be applied to the electronic device 100 of the embodiments of FIG. 1 to FIG. 3. The electronic device 100 includes a display panel 110, an integrated driver chip 120, and a fingerprint sensor 130, and the integrated driver chip 120 is integrated with a display driver circuit 121 and a fingerprint sensing circuit 122. In step S510, when the plurality of pixel units 113_1 to 113_M of the display panel 110 are in the undriven state and the finger object F is in contact with the sensing area 101 of the display panel 110 to perform the fingerprint unlock operation, the display driver circuit 121 integrated in the integrated driver chip 120 drives at least one portion of the pixel units 113_1 to 113_M corresponding to the sensing area 101 such that the at least one portion of the pixel units 113_1 to 113_M provide an illumination light to the sensing area 101. In step S520, the fingerprint sensing circuit 122 integrated in the integrated driver chip 120 drives the fingerprint sensor 130 to capture the fingerprint feature image of the finger object F. Therefore, in the present embodiment, when the electronic device 100 performs the fingerprint unlock operation, the display driver circuit 121 may individually illuminate the at least one portion of the pixel units 113_1 to 113_M on the display panel 110 corresponding to the sensing area 101 of the fingerprint sensing circuit 122 without having to illuminate all the pixel units of the display panel 110. The fingerprint sensing method of the present embodiment provides the effects of power saving, convenience, and flexible operation of these pixel units.

In addition, for other element features, device characteristics, or embodiments of the electronic device 100 of the present embodiment, sufficient teaching, suggestion, and implementation description may be obtained by referring to the description of the embodiments of FIG. 1 to FIG. 4C, and therefore, detailed description thereof is omitted.

FIG. 6 is a flowchart of a fingerprint sensing method according to another embodiment of the disclosure. Referring to FIG. 1 to FIG. 3 and FIG. 6, the fingerprint sensing method of the present embodiment may be applied to the electronic device 100 of the embodiments of FIG. 1 to FIG. 3. The electronic device 100 also has a function of automatically monitoring the display panel 110 in addition to the fingerprint sensing method described in each of the above embodiments. Specifically, if the display panel 110 is an active matrix organic light-emitting display, then attenuation in brightness occurs to the display panel 110 as the usage time is increased. However, in order to increase the service life of the active matrix organic light-emitting display, the electronic device 100 of the present embodiment may monitor through the light-emitting state image of the display panel 110 captured by the fingerprint sensor 130. Moreover, when the brightness of the display panel 110 is attenuated, the driving voltage or the driving current of a portion of or all of the pixel units of the display panel 110 may be instantly adjusted. Therefore, the electronic device 100 may execute the following steps S610 to S630.

In step S610, the fingerprint sensing circuit 122 drives the fingerprint sensor 130 to capture the light-emitting state image of the sensing area 111 of the display panel 110. In step S620, the fingerprint sensing circuit 122 analyzes the light-emitting state image, so that the integrated driver chip 120 correspondingly adjusts the driving voltage or the driving current provided by the display driver circuit 121 to the display panel 110 according to the light-emitting state image. Therefore, the display panel 110 may instantly adjust the driving voltage or the driving current of the display panel 110. Moreover, in step S630, the integrated driver chip 120 may record the adjustment history of the driving voltage or the driving current and return the adjustment history to an external cloud server in a wired or wireless communication transmission manner. In other words, the electronic device 100 may also synchronously return the adjustment history of the driving voltage or the driving current to the external cloud server provided by the manufacturer, so as to effectively provide feedback on the usage performance of the display panel 110 to the manufacturer. Therefore, the manufacturer may perform big data analysis based on the feedback and effectively grasp and improve the panel quality of the display panel 110.

Further, steps S610 to S630 of the present embodiment may be executed, for example, subsequent to step S520 of the above FIG. 5 embodiment. In other words, the electronic device 100 may simultaneously monitor the display panel 110 for brightness attenuation during the fingerprint unlock operation and instantly compensate and adjust the driving voltage or the driving current of the display panel 110. In an embodiment, steps S610 to S630 of the present embodiment may also be independent operations, and are not limited to being executed after step S520 of the above FIG. 5 embodiment. In addition, for other element features, device characteristics, or embodiments of the electronic device 100 of the present embodiment, sufficient teaching, suggestion, and implementation description may be obtained by referring to the description of the embodiments of FIG. 1 to FIG. 4C, and therefore, detailed description thereof is omitted.

Based on the above, the electronic device and the fingerprint sensing method of the disclosure may integrate a display driver circuit and an integrated driver chip of a fingerprint sensing circuit to drive the display panel and the fingerprint sensor, and when fingerprint sensing is performed, a portion of the pixel units corresponding to the sensing area of the display panel may be instantly driven without driving other pixel units outside the sensing area. Moreover, when fingerprint sensing is performed, a portion of the plurality of pixel units in the sensing area of the display panel may be illuminated to display a light source pattern having at least one bright area pattern or at least one dark area pattern with periodic variation or non-periodic variation. Moreover, illumination light is accordingly provided to the finger object that touches the sensing area of the display panel. Therefore, the electronic device and the fingerprint sensing method of the disclosure have the effects of low power consumption and rapid sensing, and may also generate a good fingerprint feature image, so that the accuracy of fingerprint recognition may be effectively improved.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. An electronic device, comprising:
a display panel comprising a plurality of pixel units arranged in an array;
a fingerprint sensor disposed below a sensing area of the display panel; and
an integrated driver chip coupled to the display panel and the fingerprint sensor and integrated with a display driver circuit and a fingerprint sensing circuit, wherein the display driver circuit is configured to drive the display panel, and the fingerprint sensing circuit is configured to drive the fingerprint sensor,
wherein when the pixel units of the display panel are in an undriven state and a finger object is in contact with the sensing area of the display panel to perform a fingerprint unlock operation, the display driver circuit drives at least one portion of the pixel units corresponding to the sensing area such that the at least one portion of the pixel units provide an illumination light to the sensing area, where the at least one portion of the driven pixel units of the display panel in the sensing area continuously displays a plurality of light source patterns having different periodic variation patterns, and the fingerprint sensing circuit drives the fingerprint sensor to capture a plurality of fingerprint feature images of the finger object,
wherein the fingerprint sensing circuit superimposes the fingerprint feature images to generate a recombined fingerprint feature image,
wherein each one of the plurality of light source pattern comprises a plurality of bright area patterns arranged separately, and there is at least one dark area pattern between any indirectly adjacent two bright patterns area in the plurality of bright area patterns,
wherein each of the plurality of bright area patterns is composed of a plurality of directly adjacent illuminated pixel units arranged continuously and non-intermittently, and there is no dark area pattern between any consecutive two directly adjacent illuminated pixel units in the each of the plurality of bright area patterns.

2. The electronic device of claim 1, wherein the sensing area of the display panel is smaller than a display area of the display panel.

3. The electronic device of claim 1, wherein a non-sensing area of the display panel corresponds to another portion of the pixel units, and when the finger object is in contact with the sensing area of the display panel to perform the fingerprint unlock operation, the other portion of the pixel units corresponding to the non-sensing area remains in the undriven state.

4. The electronic device of claim 1, wherein the display panel is an active-matrix organic light-emitting display, and the pixel units comprise a plurality of color pixel types.

5. The electronic device of claim 4, wherein when the finger object is in contact with the sensing area of the display panel to perform the fingerprint unlock operation, the at least one portion of the pixel units driven by the display driver circuit is at least one of the color pixel types.

6. The electronic device of claim 1, wherein when the finger object is in contact with the sensing area of the display panel to perform the fingerprint unlock operation, the at least one portion of the driven pixel units of the display panel in the sensing area display a light source pattern, and the light source pattern is a periodic variation pattern or a non-periodic variation pattern,
wherein the light source pattern comprises a plurality of bright area patterns and a plurality of dark area patterns.

7. The electronic device of claim 6, wherein the light source pattern is the periodic variation pattern, and at least one of the bright area patterns and the dark area patterns in at least one of a first direction and a second direction are periodically arranged.

8. The electronic device of claim 1, wherein the fingerprint sensing circuit is further used to drive the fingerprint sensor to capture a light-emitting state image of the sensing area of the display panel, and the fingerprint sensing circuit analyzes the light-emitting state image, so that the integrated driver chip adjusts a driving voltage or a driving current provided by the display driver circuit to the display panel according to the light-emitting state image.

9. The electronic device of claim 8, wherein the integrated driver chip is further used to record an adjustment history of the driving voltage or the driving current and return the adjustment history to a cloud server.

10. A fingerprint sensing method adapted for an electronic device, wherein the electronic device comprises a display panel, a fingerprint sensor, and an integrated driver chip, and the display panel comprises a plurality of pixel units arranged in an array, wherein the fingerprint sensing method comprises:
driving at least one portion of the pixel units corresponding to a sensing area through a display driver circuit integrated in the integrated driver chip when the pixel units of the display panel are in an undriven state and a finger object is in contact with the sensing area of the display panel to perform a fingerprint unlock operation such that the at least one portion of the pixel units provide an illumination light to the sensing area, and continuously displaying a plurality of light source patterns having different periodic variation patterns through the at least one portion of the driven pixel units of the display panel in the sensing area;

driving the fingerprint sensor through a fingerprint sensing circuit integrated in the integrated driver chip to capture a plurality of fingerprint feature images of the finger object; and superimposing the fingerprint feature images through the fingerprint sensing circuit to generate a recombined fingerprint feature image, wherein each one of the plurality of light source pattern comprises a plurality of bright area patterns arranged separately, and there is at least one dark area pattern between any indirectly adjacent two bright patterns area in the plurality of bright area patterns, wherein each of the plurality of bright area patterns is composed of a plurality of directly adjacent illuminated pixel units arranged continuously and non-intermittently, and there is no dark area pattern between any consecutive two directly adjacent illuminated pixel units in the each of the plurality of bright area patterns.

11. The fingerprint sensing method of claim 10, wherein the sensing area of the display panel is smaller than a display area of the display panel.

12. The fingerprint sensing method of claim 10, wherein a non-sensing area of the display panel corresponds to another portion of the pixel units, and when the finger object is in contact with the sensing area of the display panel to perform the fingerprint unlock operation, the other portion of the pixel units corresponding to the non-sensing area remains in the undriven state.

13. The fingerprint sensing method of claim 10, wherein the display panel is an active-matrix organic light-emitting display, and the pixel units comprise a plurality of color pixel types.

14. The fingerprint sensing method of claim 13, wherein when the finger object is in contact with the sensing area of the display panel to perform the fingerprint unlock operation, the at least one portion of the pixel units driven by the display driver circuit is at least one of the color pixel types.

15. The fingerprint sensing method of claim 10, wherein the step of driving the at least one portion of the pixel units corresponding to the sensing area through the display driver circuit integrated in the integrated driver chip comprises:

displaying a light source pattern through the at least one portion of the driven pixel units of the display panel in the sensing area, and the light source pattern is a periodic variation pattern or a non-periodic variation pattern, wherein the light source pattern comprises a plurality of bright area patterns and a plurality of dark area patterns.

16. The fingerprint sensing method of claim 15, wherein the light source pattern is the periodic variation pattern, and at least one of the bright area patterns and the dark area patterns in at least one of a first direction and a second direction are periodically arranged.

17. The fingerprint sensing method of claim 10, further comprising:

driving the fingerprint sensor through the fingerprint sensing circuit to capture a light-emitting state image of the sensing area of the display panel; and analyzing the light-emitting state image through the fingerprint sensing circuit so that the integrated driver chip adjusts a driving voltage or a driving current provided by the display driver circuit to the display panel according to the light-emitting state image.

18. The fingerprint sensing method of claim 17, further comprising:

recording an adjustment history of the driving voltage or the driving current through the integrated driver chip and returning the adjustment history to a cloud server.

\* \* \* \* \*